(12) United States Patent
Tanaka et al.

(10) Patent No.: US 8,957,923 B2
(45) Date of Patent: Feb. 17, 2015

(54) LIGHT EMITTING DEVICE, LIGHT EMITTING ELEMENT ARRAY, AND IMAGE DISPLAY DEVICE

(71) Applicant: Oki Data Corporation, Tokyo (JP)

(72) Inventors: Satoshi Tanaka, Takasaki (JP); Takahito Suzuki, Takasaki (JP); Shintaro Tanaka, Takasaki (JP)

(73) Assignee: Oki Data Corporation, Tokyo (JP)

( * ) Notice: Subject to any disclaimer, the term of this patent is extended or adjusted under 35 U.S.C. 154(b) by 135 days.

(21) Appl. No.: 13/628,272

(22) Filed: Sep. 27, 2012

(65) Prior Publication Data
US 2013/0076804 A1   Mar. 28, 2013

(30) Foreign Application Priority Data
Sep. 28, 2011   (JP) .................................. 2011-212825

(51) Int. Cl.
| | | |
|---|---|---|
| G09G 5/10 | (2006.01) |
| G06F 3/041 | (2006.01) |
| H01L 33/62 | (2010.01) |
| H01L 25/075 | (2006.01) |
| H01L 23/00 | (2006.01) |
| H01L 33/60 | (2010.01) |

(52) U.S. Cl.
CPC ........ *G09G 5/10* (2013.01); *H01L 33/62* (2013.01); *H01L 25/0753* (2013.01); *H01L 24/24* (2013.01); *H01L 33/60* (2013.01)
USPC .......................................... 345/690; 345/173

(58) Field of Classification Search
CPC ........... H01L 2924/00014; H01L 2224/48091; H01L 2224/48137; H01L 127/153
See application file for complete search history.

(56) References Cited

U.S. PATENT DOCUMENTS 6,790,695 B2 *   9/2004   Ogihara et al. ................. 438/33

FOREIGN PATENT DOCUMENTS

| JP | 2008-218894 A | 9/2008 |
| JP | 2010-199176 A | 9/2010 |
| JP | 2011-077447 A | 4/2011 |

* cited by examiner

*Primary Examiner* — Michael Faragalla
(74) *Attorney, Agent, or Firm* — Panitch Schwarze Belisario & Nadel LLP

(57) ABSTRACT

A light emitting device includes: a wiring including an AuGeNi layer; and a semiconductor light emitting element bonded to the surface of the AuGeNi layer with the aid of intermolecular force, and electrically connected to the wiring.

14 Claims, 16 Drawing Sheets

| Z1 [nm] | Z2 [nm] | DIFFERENCE IN HEIGHT [nm] | DISTANCE [nm] | DIFFERENCE IN ANGLE [°] |
|---|---|---|---|---|
| 0.71 | 1.55 | 0.846280 | 155.64 | 0.3 |
|  |  |  |  |  |
|  |  |  |  |  |
|  |  |  |  |  |
|  |  |  |  |  |

| Z1 [nm] | Z2 [nm] | DIFFERENCE IN HEIGHT [nm] | DISTANCE [nm] | DIFFERENCE IN ANGLE [°] |
|---------|---------|---------------------------|---------------|--------------------------|
| 0.68 | 1.82 | 1.138678 | 116.27 | 0.6 |
| | | | | |
| | | | | |
| | | | | |
| | | | | |

| Z1 [nm] | Z2 [nm] | DIFFERENCE IN HEIGHT [nm] | DISTANCE [nm] | DIFFERENCE IN ANGLE [°] |
|---|---|---|---|---|
| 16.00 | 50.72 | 34.71608 | 202.67 | 9.7 |
| 50.77 | 59.64 | 8.872476 | 106.16 | 4.8 |
| | | | | |
| | | | | |
| | | | | |

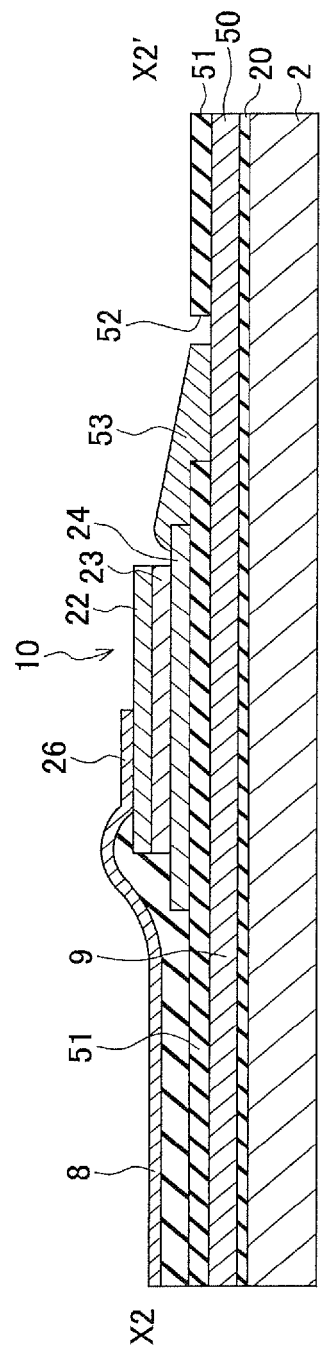
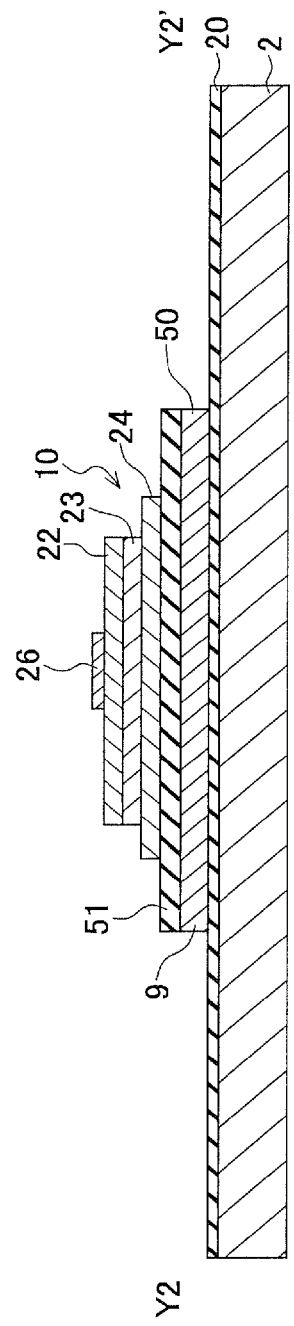

LIGHT EMITTING DEVICE, LIGHT EMITTING ELEMENT ARRAY, AND IMAGE DISPLAY DEVICE

FIELD OF THE INVENTION

The present invention relates to a light emitting device, a light emitting element array, and an image display device.

DESCRIPTION OF THE RELATED ART

Japanese Laid-Open Patent Publication No. 2010-199176 discloses a display device which includes row-wise wirings; column-wise wirings; a planarizing insulating film which planarizes the surface of the row-wise wirings or the column-wise wirings; and semiconductor thin film light emitting elements which are bonded onto the planarizing insulating film with the aid of intermolecular force, and electrically connected to the row-wise wirings and the column-wise wirings.

In the light emitting device using the semiconductor light emitting elements, there has been a demand for improved heat dissipation from the semiconductor light emitting elements.

SUMMARY OF THE INVENTION

In an aspect of the present invention, it is intended to provide a light emitting device, a light emitting element array, and an image display device, having excellent heat dissipation from the semiconductor light emitting element.

According to an aspect of the present invention, there is provided a light emitting device including: a wiring including an AuGeNi layer; and a semiconductor light emitting element bonded to the surface of the AuGeNi layer with the aid of intermolecular force, and electrically connected to the wiring.

According to another aspect of the present invention, there is provided a light emitting element array including: one or more wirings each including an AuGeNi layer; and a plurality of semiconductor light emitting elements arranged over the one or more wirings to form a linear array or a two-dimensional array, each of which being bonded to the surface of the AuGeNi layer of the correspondent wiring with the aid of intermolecular force, and being electrically connected to the correspondent wiring.

According to still another aspect of the present invention, there is provided an image display device including: a plurality of wirings each including an AuGeNi layer, extended in a first direction, and arranged in a second direction which crosses the first direction; a plurality of semiconductor light emitting elements arranged over the plurality of wirings in the first and second directions to form a two-dimensional array, each of which being bonded to the surface of the AuGeNi layer of the correspondent wiring with the aid of intermolecular force, and being electrically connected to the correspondent wiring; and a drive unit electrically connected through the plurality of wirings to the plurality of semiconductor light emitting elements, so as to drive the plurality of semiconductor light emitting elements based on image information.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 13A and 13B are cross sectional views of the light emitting device illustrated in FIG. 12.

DETAILED DESCRIPTION OF THE INVENTION

Embodiments of the present invention will be described below, referring to the attached drawings.

Embodiment 1

<Configuration of Image Display Device>

Figure 1:
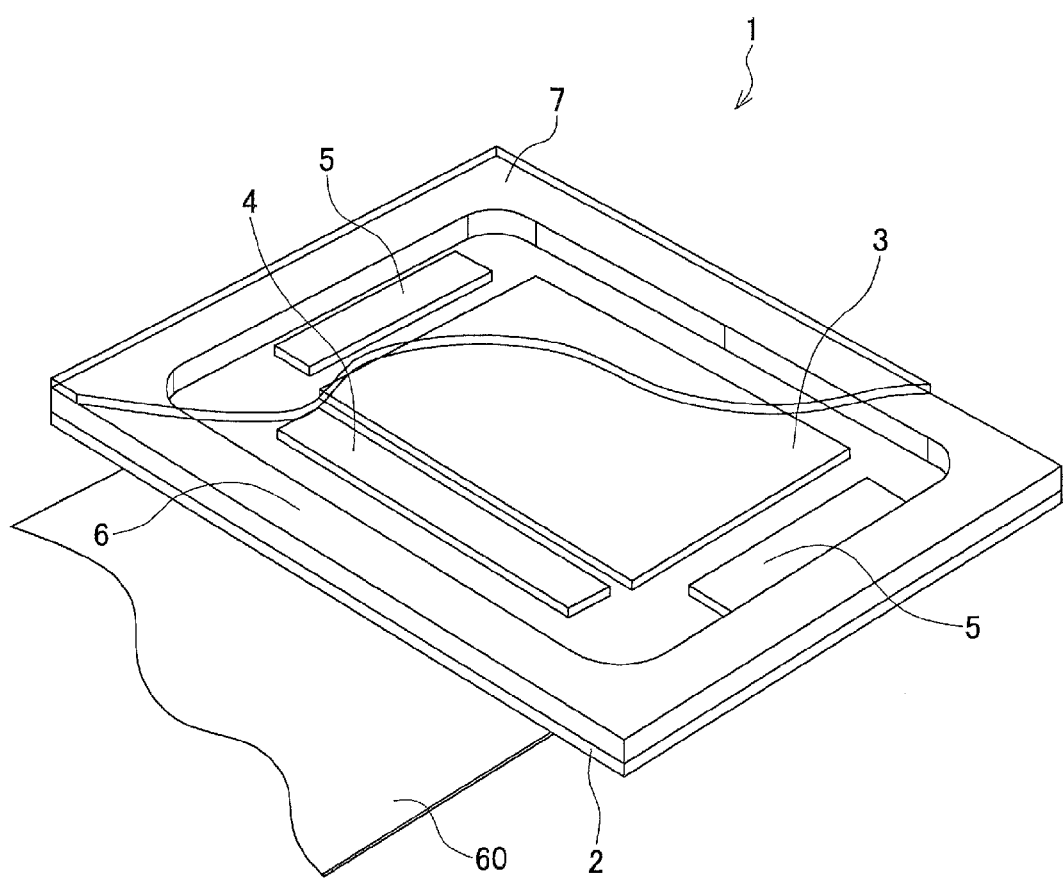
FIG. 1 is a perspective outside view illustrating an image display device according to Embodiment 1.

FIG. 1 is a perspective outside view illustrating an image display device 1 according to Embodiment 1.

As seen in FIG. 1, the image display device 1 has a mounting substrate 2 for a semiconductor chip (which is typically a chip-on-board substrate, and will be referred to as "COB", hereinafter). The COB 2 is configured by a semiconductor substrate typically made of Si, GaAs, GaP, InP, GaN, ZnO or the like; a ceramic substrate typically made of AlN, $Al_2O_3$ or the like; a metal substrate typically made of Cu, Al or the like; or a plastic substrate. On the COB 2, there are fixed a light emitting element array (also referred to as "light emitting element panel") 3 typically configured by a plurality of light emitting elements; and an anode driver integrated circuit (referred to as "anode driver IC 4", hereinafter) and cathode driver integrated circuits (referred to as "cathode driver ICs 5", hereinafter), which are drive circuits for driving the light emitting element array 3. The light emitting element array 3, the anode driver IC 4, and the cathode driver ICs 5 are electrically connected to each other typically by wire bonding. The anode driver IC 4 and the cathode driver ICs 5 are bonded to the COB 2, typically by using silver paste, resin or the like. The anode driver IC 4 and the cathode driver ICs 5 are connected through a flexible cable 60 to an unillustrated control device.

Over the COB 2, a cover 7 for protecting the light emitting element array 3, the anode driver IC 4, and the cathode driver ICs 5 is attached while placing a frame-like spacer 6 in between. The cover 7 is illustrated in FIG. 1 in a partially broken manner. The spacer 6 is designed to have a thickness larger than the height measured from the mounting surface of the COB 2 up to the highest point of an unillustrated metal wires used in wire bonding. A portion of the cover 7 corresponding to an area of the light emitting element array 3, having a plurality of light emitting elements formed therein, is preferably made of a material having a transmittance of 80% or more, such as glass, acrylic resin, or polycarbonate resin.

The COB 2 and the spacer 6, and, the spacer 6 and the cover 7, may be bonded using a resin or the like, or may be fixed by screws inserted into holes formed in the COB 2, the spacer 6 and the cover 7. Alternatively, the spacer 6 and the cover 7 may be integrated. Still alternatively, the COB 2 and the spacer 6 may be integrated.

While FIG. 1 illustrates an exemplary configuration having two cathode driver ICs 5, another circuit configuration may have only a single cathode driver IC 5, and still another configuration may have another layout of the cathode driver ICs 5.

Figure 2:
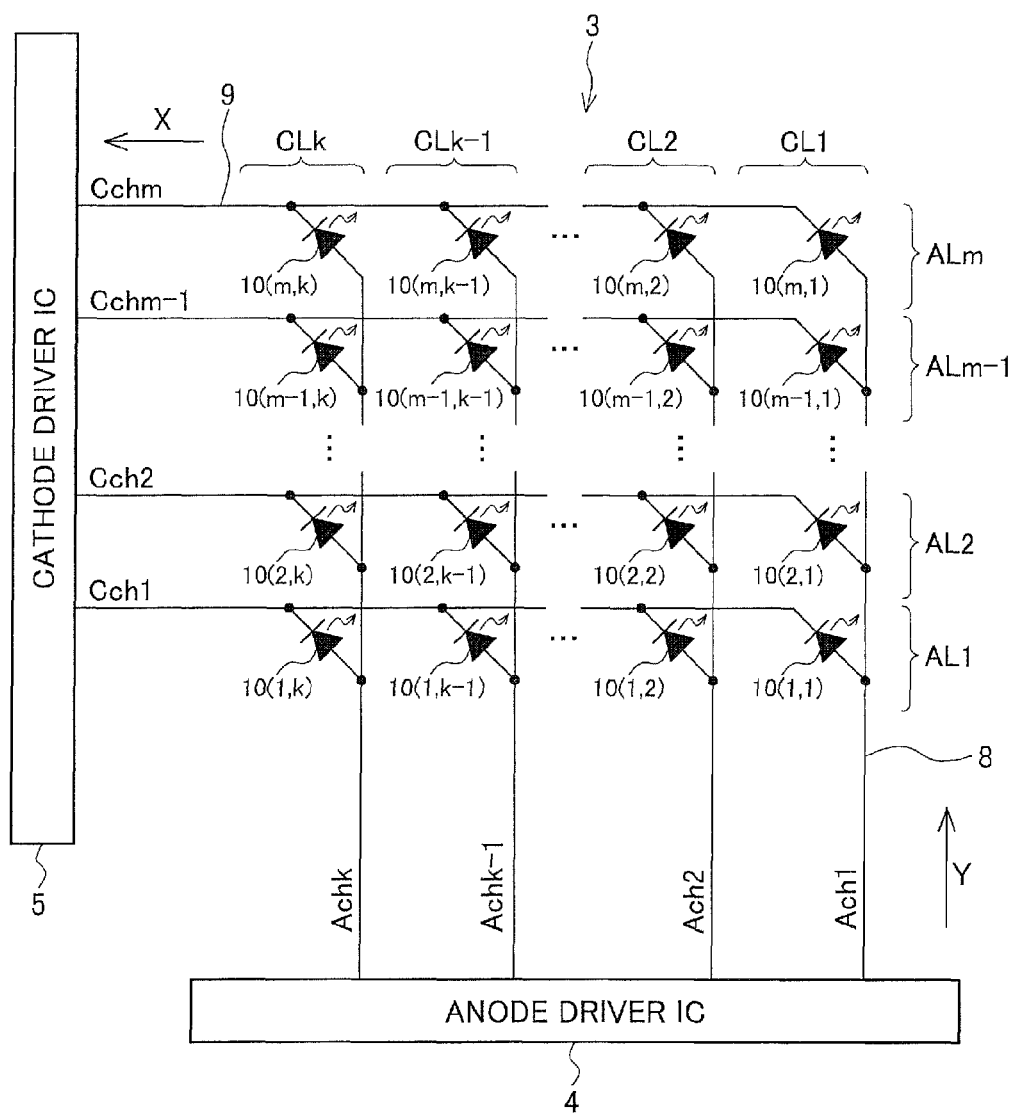
FIG. 2 is a circuit diagram illustrating an equivalent circuit of the image display device illustrated in FIG. 1.

FIG. 2 is a circuit diagram illustrating an equivalent circuit of the image display device 1 illustrated in FIG. 1. For simplicity of explanation, FIG. 2 illustrates a configuration having one anode driver IC 4 and one cathode driver IC 5.

The light emitting element array 3 is typically configured as a passive light emitting device in the form of a m-row, k-column dot matrix. The light emitting element array 3 has a plurality of (k) anode wirings 8, a plurality of (m) cathode wirings 9, and a plurality of (m×k) semiconductor light emitting elements 10(1,1) to 10(m,k). Each semiconductor light emitting element is typically a light emitting diode (LED).

The plurality of anode wirings 8 are extended in the column-wise direction (vertical direction) Y, and arranged in parallel in the row-wise direction (horizontal direction) X which crosses the column-wise direction Y, so as to form a plurality of anode channels Ach1 to Achk.

The plurality of cathode wirings 9 are extended in the row-wise direction (horizontal direction, or first direction) X, and arranged in the column-wise direction (horizontal direction, or second direction) Y in parallel, so as to form a plurality of cathode channels Cch1 to Cchm.

Each of the plurality of semiconductor light emitting elements 10(1,1) to 10(m,k) is provided at an intersection of each anode wiring 8 and each cathode wiring 9, and is electrically connected to the correspondent anode wiring 8 and the cathode wiring 9. Note that the suffix (i,j) of each semiconductor light emitting element 10 denotes the position of the semiconductor light emitting element 10 in the row-wise and column-wise directions, so that semiconductor light emitting element 10(i,j) is a semiconductor light emitting element which resides in the i-th row and in the j-th column. The suffix will not be shown in some cases in the description below.

There are m anode sections AL1 to ALm in the column-wise direction Y, and there are k cathode sections CL1 to CLk in the row-wise direction X. Each anode wiring 8 is connected to the anode driver IC 4, and each cathode wiring 9 is connected to the cathode driver IC 5. In another exemplary case where two cathode driver ICs 5 are used, the cathode wirings 9 in the odd-numbered row are connected to one cathode driver IC 5, and the cathode wirings 9 in the even-numbered row are connected to the other cathode driver IC 5, for example.

Figure 3:
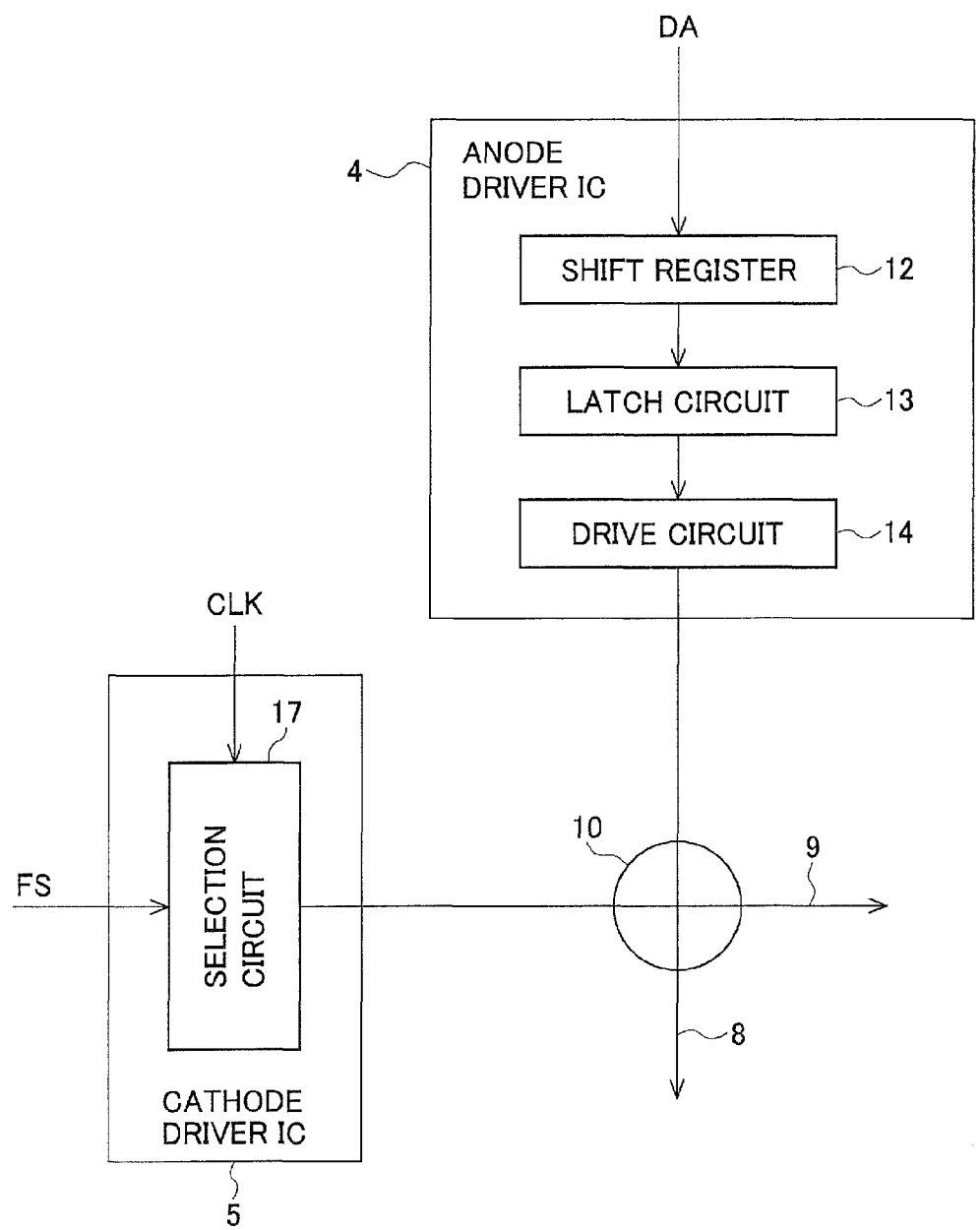
FIG. 3 is a schematic block diagram illustrating a configuration including an anode driver IC and a cathode driver IC illustrated in FIG. 2.

FIG. 3 is a schematic block diagram illustrating a configuration including the anode driver IC 4 and the cathode driver IC 5 illustrated in FIG. 2. For simplicity of explanation, FIG. 3 representatively illustrates one anode wiring 8, one cathode wiring 9, and one semiconductor light emitting element 10.

The anode driver IC 4 supplies electric currents to the columns of the semiconductor light emitting elements 10 connected to the respective anode wirings 8, in response to display data DA (for example, emission data which specifies non-emission or emission) received as image information from an unillustrated control device. In the example illustrated in FIG. 3, the anode driver IC 4 has a shift register 12, a latch circuit 13, and a drive circuit 14. The shift register 12 receives the serial emission data DA from the unillustrated control device, and converts the serial emission data into parallel emission data to be output. The latch circuit 13 is connected to the output side of the shift register 12, and latches the parallel emission data output from the shift register 12. The drive circuit 14 is connected to the output side of the latch circuit 13, and amplifies the output of the latch circuit 13. To the output side of the drive circuit 14, the plurality of anode wirings 8 are connected.

The cathode driver IC 5 scans the rows of the semiconductor light emitting elements 10 connected to the respective cathode wirings 9, based on clock CLK and frame signal FS supplied by the unillustrated control device, and typically includes a selection circuit 17.

<Configuration of Light Emitting Element Array>

Figure 4:
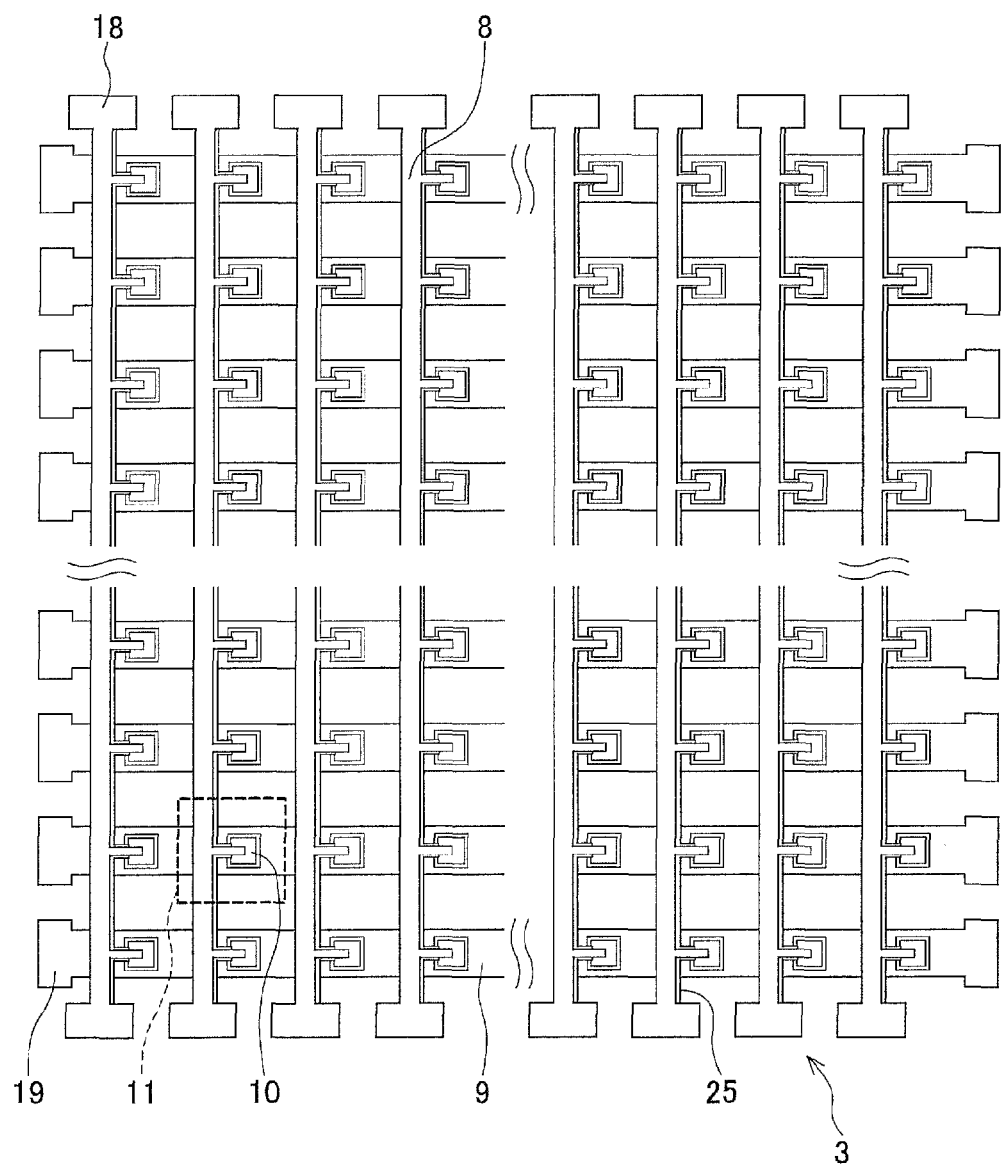
FIG. 4 is a schematic plan view illustrating a configuration of an light emitting element array illustrated in FIG. 1.

FIG. 4 is a schematic plan view illustrating a configuration of the light emitting element array 3 illustrated in FIG. 1.

As seen in FIG. 4, the light emitting element array 3 has the plurality of anode wirings 8 extended in the column-wise direction, the plurality of cathode wirings 9 extended in the row-wise direction, and the plurality of semiconductor light emitting elements 10 arranged to form a two-dimensional matrix. The semiconductor light emitting elements 10 are arranged over the cathode wirings 9. More specifically, over each cathode wiring 9, the semiconductor light emitting elements 10, the number of which is the same as the number (k) of the anode wirings 8, are arranged in the row-wise direction.

The anode wirings 8 are respectively connected to anode wiring extracting pads 18, and are electrically connected through the anode wiring extracting pads 18 to the anode driver IC 4 typically by wire bonding. On the other hand, the cathode wirings 9 are respectively connected to cathode wiring extracting pads 19, and electrically connected through the cathode wiring extracting pads 19 to the cathode driver IC 5 typically by wire bonding.

In FIG. 4, a portion surrounded by a broken line corresponds to one light emitting device 11. Specifically, the light emitting device 11 includes the semiconductor light emitting element 10, and the anode wiring 8 and the cathode wiring 9 electrically connected to the semiconductor light emitting element 10.

<Configuration of Light Emitting Device>

Figure 5:
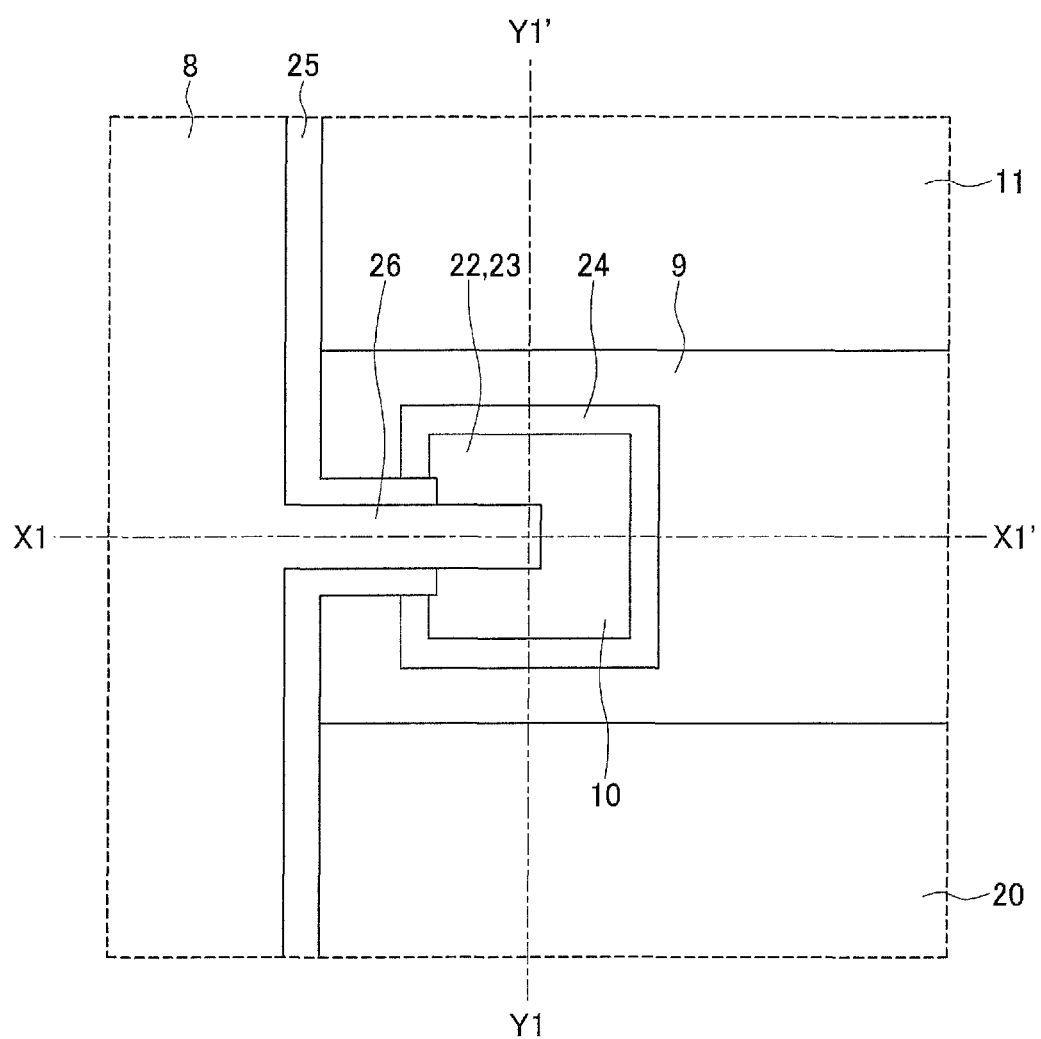
FIG. 5 is a plan view illustrating a light emitting device illustrated in FIG. 4.
Figure 6A:
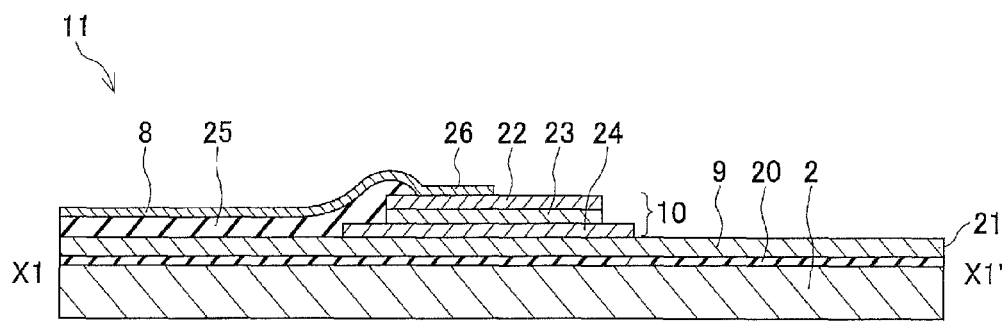
FIGS. 6A and 6B are cross sectional views illustrating the light emitting device illustrated in FIG. 5.
Figure 6B:
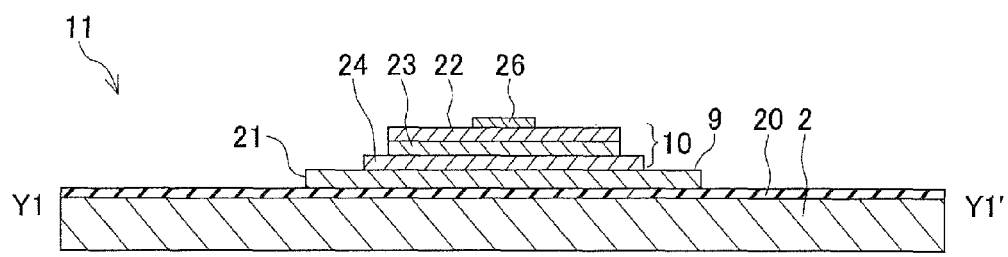

FIG. 5 is a plan view illustrating the light emitting device 11 illustrated in FIG. 4. FIG. 6A and FIG. 6B are cross sectional views of the light emitting device 11 illustrated in FIG. 5, taken along line X1-X1' and line Y1-Y1', respectively.

On the COB 2, there is formed an insulating film 20, and on the insulating film 20, there is formed the cathode wiring 9 with a predetermined pattern. The insulating film 20 is typically made of SiN, $Al_2O_3$, $SiO_2$ or the like. The cathode wiring 9 will be detailed later.

The semiconductor light emitting element 10 is bonded on the cathode wiring 9 with the aid of intermolecular force. In the illustrated example, the semiconductor light emitting element 10 includes a P-type semiconductor layer 22, a light emitting layer 23, and an N-type semiconductor layer 24. The bottom surface of the N-type semiconductor layer 24 is bonded to the top surface of the cathode wiring 9, and thereby the semiconductor light emitting element 10 is electrically connected to the cathode wiring 9. More specifically, the semiconductor light emitting element 10 is film like, that is, a thin-film semiconductor light emitting element. The semiconductor light emitting element 10 is formed by epitaxial growth such as Metal Organic Chemical Vapor Deposition (MOCVD), typically by using an AlInGaP-based quaternary mixed crystal semiconductor material; or Group III-V compound semiconductor material such as GaAs, AlAs, InAs, AlN, GaN, InN, InP, GaP, AlP or the like. The P-type semiconductor layer 22 and the light emitting layer 23, and, the light emitting layer 23 and the N-type semiconductor layer 24, are formed so as to contact with each other.

On the COB 2, the anode wiring 8 is formed according to a predetermined pattern, so as to cross the cathode wiring 9 at right angle. The anode wiring 8 is made of Au-based metal such as Au, Ti/Pt/Au, Ti/Au, AuGeNi/Au, AuGe/Ni/Au or the like, or Al-based metal such as Al, Ni/Al, Ni/AlSiCu, Ti/Al or the like.

From the anode wiring 8, a connection line 26 is extended so as to be brought into ohmic contact with the top surface of the P-type semiconductor layer 22, and thereby the semiconductor light emitting element 10 is electrically connected with the anode wiring 8.

Between the anode wiring 8 and the cathode wiring 9, and, between the connection line 26, and the cathode wiring 9, the light emitting layer 23 and the N-type semiconductor layer 24, there is formed an interlayer insulating film 25. The interlayer insulating film 25 is typically made of SiN, $Al_2O_3$, or $SiO_2$.

<Cathode Wiring>

The cathode wiring 9 will be explained below.

From the viewpoint of ensuring a sufficient level of strength of the intermolecular force between the cathode wiring 9 and the semiconductor light emitting element 10, the cathode wiring 9 preferably has a highly smooth surface, the roughness of which is preferably 5 nm or smaller. The roughness herein means a representative difference of height between peaks and valleys in a micro area of the surface of the wiring (for example, a 5-μm square area). The roughness is specifically measured using an atomic force microscope (AFM).

If the cathode wiring is formed of Au or Al, hillocks and voids of several tens nanometers to several hundreds nanometers may appear on the surface of the cathode wiring when the cathode wiring is treated at high temperatures (typically at 250° C. or above). This is ascribable to formation of polycrystal, as a result of exposure of metal to high temperatures. The high-temperature treatment inevitably takes place in the process of manufacturing, for example, in a step of lowering the contact resistance of a semiconductor layer brought into contact with the anode wiring or the cathode wiring, and in a step of forming the interlayer insulating film.

Even when Au or Al is used, it is possible to suppress the surface roughness of the cathode wiring to 5 nm or smaller, and to bond the cathode wiring and the semiconductor light emitting element with the aid of intermolecular force, if the timing is before the high-temperature treatment. The intermolecular force between the cathode wiring and the semiconductor light emitting element is, however, weakened by high-temperature treatment after the bonding, due to formation of polycrystal of metal, and thereby the semiconductor light emitting element may separate from the cathode wiring.

On the other hand, in the case where the cathode wiring is treated at high temperatures before being bonded to the semiconductor light emitting element, hillocks and voids appear in the high-temperature treatment so as to increase the surface roughness of the cathode wiring, and this makes it difficult to bond the semiconductor light emitting element to the cathode wiring with the aid of intermolecular force.

Now in this embodiment aimed at suppressing the surface roughness, and more specifically aimed at suppressing the surface roughness of the cathode wiring after the high-temperature treatment to 5 nm or smaller, the cathode wiring 9 includes an AuGeNi layer 21, and the semiconductor light emitting element 10 is bonded to the surface of the AuGeNi layer 21 with the aid of intermolecular force.

The AuGeNi layer 21 is mainly made of Au, and preferably has a mixing ratio of Au with Ge and Ni of 86 to 94 wt %:3 to 7 wt %:3 to 7 wt % from the viewpoint of suppressing the surface roughness. The ratio in this example is 90 wt %:5 wt %:5 wt %.

The cathode wiring 9 in this example includes the AuGeNi layer 21 as a surface layer, and the semiconductor light emitting element 10 is directly bonded to the surface of the AuGeNi layer 21 of the cathode wiring 9. While the cathode wiring 9 illustrated in FIG. 6 has a single-layered structure of the AuGeNi layer 21 only, it may have a stacked structure having a plurality of layers stacked therein.

<Method of Manufacturing Light Emitting Element Array and Light Emitting Device>

Exemplary methods of manufacturing of the light emitting element array 30 and the light emitting device 11 will be explained, referring to FIG. 5 and FIGS. 6A, 6B.

First, on the COB 2, the insulating film 20 composed of SiN, $Al_2O_3$, $SiO_2$ or the like is formed by plasma CVD, sputtering, thermal oxidation or the like.

Next, the cathode wirings 9 composed of AuGeNi are formed according to a predetermined pattern on the insulating film 20, by lithography combined with sputtering, metal vapor deposition or the like. Sputtering is more preferable by virtue of smaller size of metal particle.

Next, semiconductor light emitting elements 10 are bonded to predetermined positions on the cathode wirings 9, with the aid of intermolecular force. For example, the semiconductor light emitting elements 10 are once formed on another substrate, and then transferred from the substrate onto the cathode wirings 9.

Next, on the COB 2 having the cathode wirings 9 and the semiconductor light emitting elements 10 arranged thereon, the interlayer insulating film 25 is formed according to a predetermined pattern, by plasma CVD, sputtering, thermal oxidation or the like.

Next, on the COB 2 having the interlayer insulating film 25 formed thereon, the anode wirings 8 and connection lines 26 are formed according to a predetermined pattern, by lithography combined with sputtering, metal vapor deposition, or the like.

<Operation of Image Display Device>

Exemplary operation of the image display device 1 will be explained below. In the image display device 1 illustrated in FIG. 1, the dot matrix of the light emitting element array 3 is driven by passive operation. More specifically, referring now to FIG. 2, the cathode driver IC 5 scans the cathode channels Cch1 to Cchm from the bottom to the top in the drawing, so as to sequentially select the cathode channels one by one. On the other hand, the anode driver IC 4 outputs currents corresponding to image information to the anode wirings 8 of the respective anode channels. The currents fed by the anode driver IC 4 flow, through the semiconductor light emitting elements 10 and cathode wiring 9 which correspond to the cathode channels selected by the cathode driver IC 5, into the cathode driver IC 5. Accordingly, at a certain point of time, only a plurality of semiconductor light emitting elements 10 on the cathode wiring 9 in the cathode channel selected by the cathode driver IC 5 emit light at levels of luminance corresponding to the image information.

In further details, upon reception of information to be displayed, the unillustrated control device supplies serial emission data to the anode driver IC 4, according to the information. The serial emission data are sequentially stored in the shift register 12 of the anode driver IC 4. The serial emission data stored in the shift register 12 are converted by the shift register 12 into parallel emission data, and stored in the latch circuit 13. The parallel emission data herein correspond to each of the plurality of semiconductor light emitting elements 10 included in a specific row (first row, for example) in the light emitting element array 3. From the latch circuit 13, parallel signals corresponding to the stored parallel emission data are output. The parallel output signals are amplified by the drive circuit 14, and constant currents corresponding to the emission data are supplied from the drive circuit 14 to the respective anode wirings 8.

On the other hand, the selection circuit 17 in the cathode driver IC 5 selects a cathode wiring 9 in a specified row (first row, for example) of the light emitting element array 3, based on the clock CLK and the frame signal FS supplied from the unillustrated control device. Accordingly, the drive currents supplied by the anode driver IC 4 flow through the respective anode wirings 8, the respective semiconductor light emitting elements 10 of the specified row, and the cathode wiring 9 of the specified row, to the cathode driver IC 5. In this way, the respective semiconductor light emitting elements 10 in the specified row cause emission in response to the emission data.

By repeating the above-described action of light emission the number of times equal to the number of the cathode wirings 9 (that is, the number of rows of the light emitting element array 3), light constituting an image of one screen which includes information to be displayed is emitted.

<Result of Observation of Surface of Cathode Wiring>

Results of observation of the surface of the cathode wiring under an AFM will be shown below. The AFM used herein was I-Trace II from SII NanoTechnology Inc., and was used for observation in the DFM (Dynamic Force Microscope) mode (also referred to as "tapping mode").

As the cathode wiring in this embodiment, a cathode wiring was formed using AuGeNi with a mixing ratio of 90 wt %:5 wt %:5 wt % by sputtering. The cathode wiring was treated at high temperature (at 350° C. for 1 hour). A 5-μm square area of the surface of the cathode wiring was observed under the AFM, before and after the high-temperature treatment.

Figure 7A:
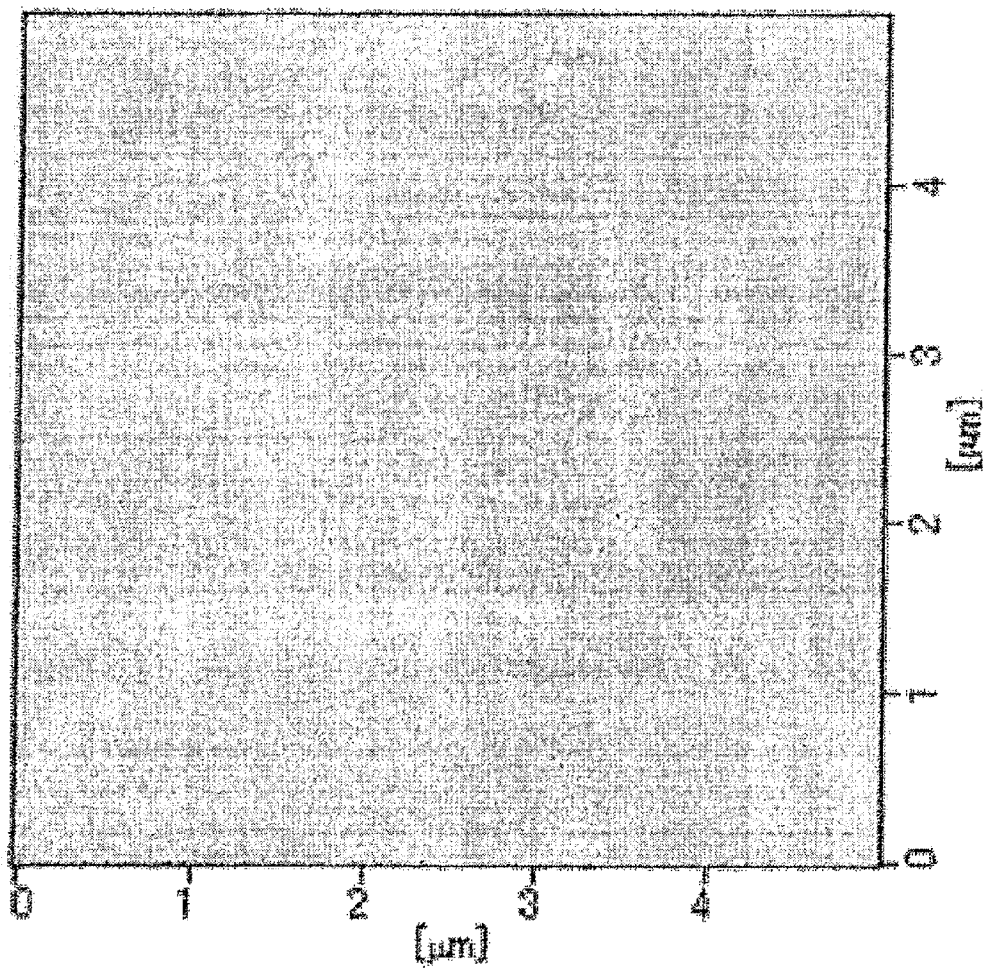
FIGS. 7A to 7C are drawings illustrating results of observation of the surface of a cathode wiring according to Embodiment 1, before high-temperature treatment.
Figures 7B, 7C:
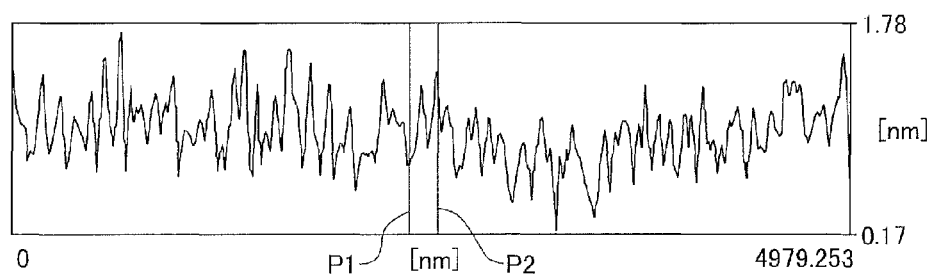
Figure 8A:
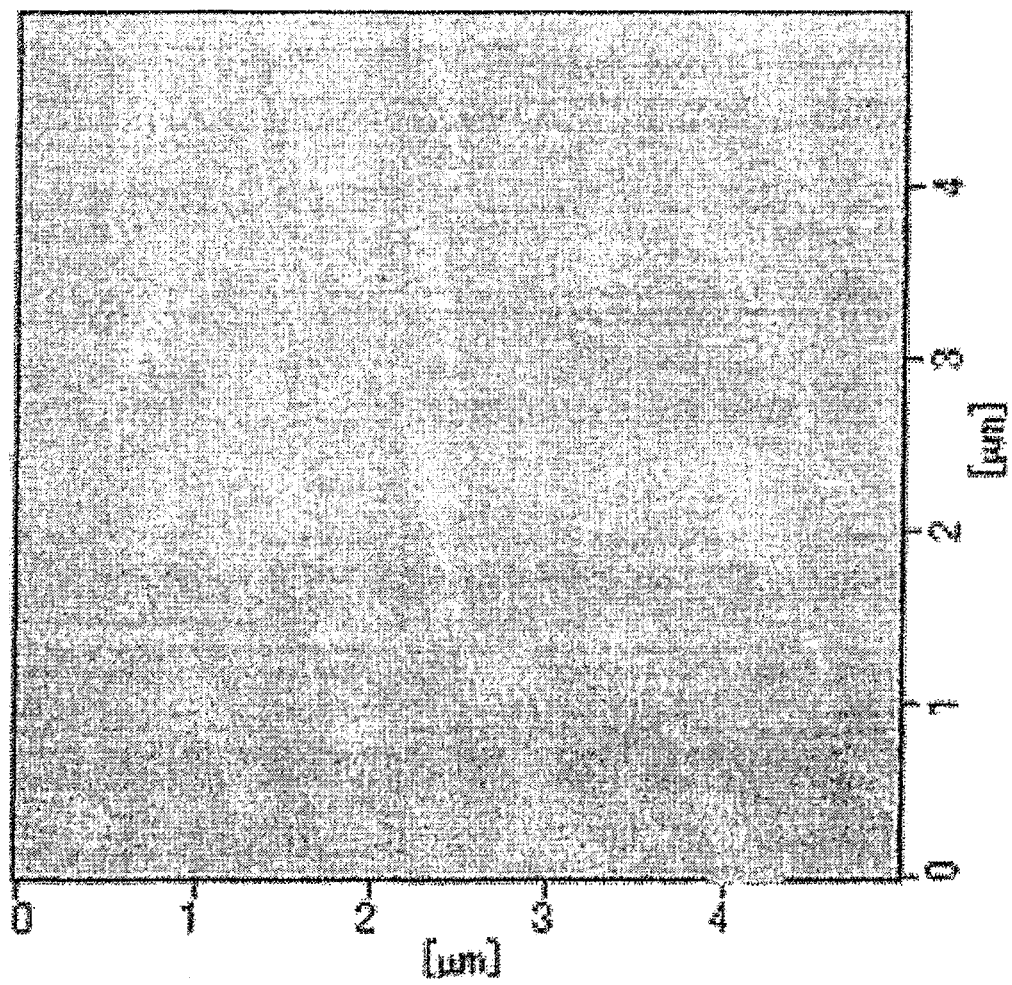
FIGS. 8A to 8C are drawings illustrating results of observation of the surface of the cathode wiring according to Embodiment 1, after high-temperature treatment.
Figures 8B, 8C:
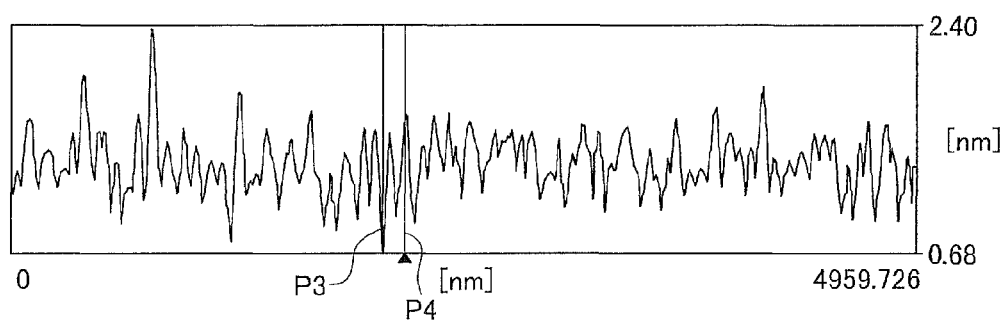

FIGS. 7A to 7C and FIGS. 8A to 8C show results of observation of the surfaces of the cathode wiring of this embodiment, before and after the high-temperature treatment, respectively. FIG. 7A and FIG. 8A are AFM images of the surfaces of the cathode wiring, FIG. 7B and FIG. 8B are cross sectional profiles of the surfaces of the cathode wiring obtained by the AFM. FIG. 7C lists the height Z1 at position P1 in FIG. 7B, height Z2 at position P2, difference in height between position P1 and position P2, and the distance between position P1 and position P2. FIG. 8C lists the height Z1 at position P3 in FIG. 8B, height Z2 at position P4, difference in height between position P3 and position P4, and the distance between position P3 and position P4.

On the other hand, as a cathode wiring in a comparative example, a cathode wiring was formed using Au by sputtering. The cathode wiring was treated at high temperature (at 350° C. for 1 hour). A 5-μm square area of the surface of the cathode wiring was observed under the AFM, before and after the high-temperature treatment.

Figure 9A:
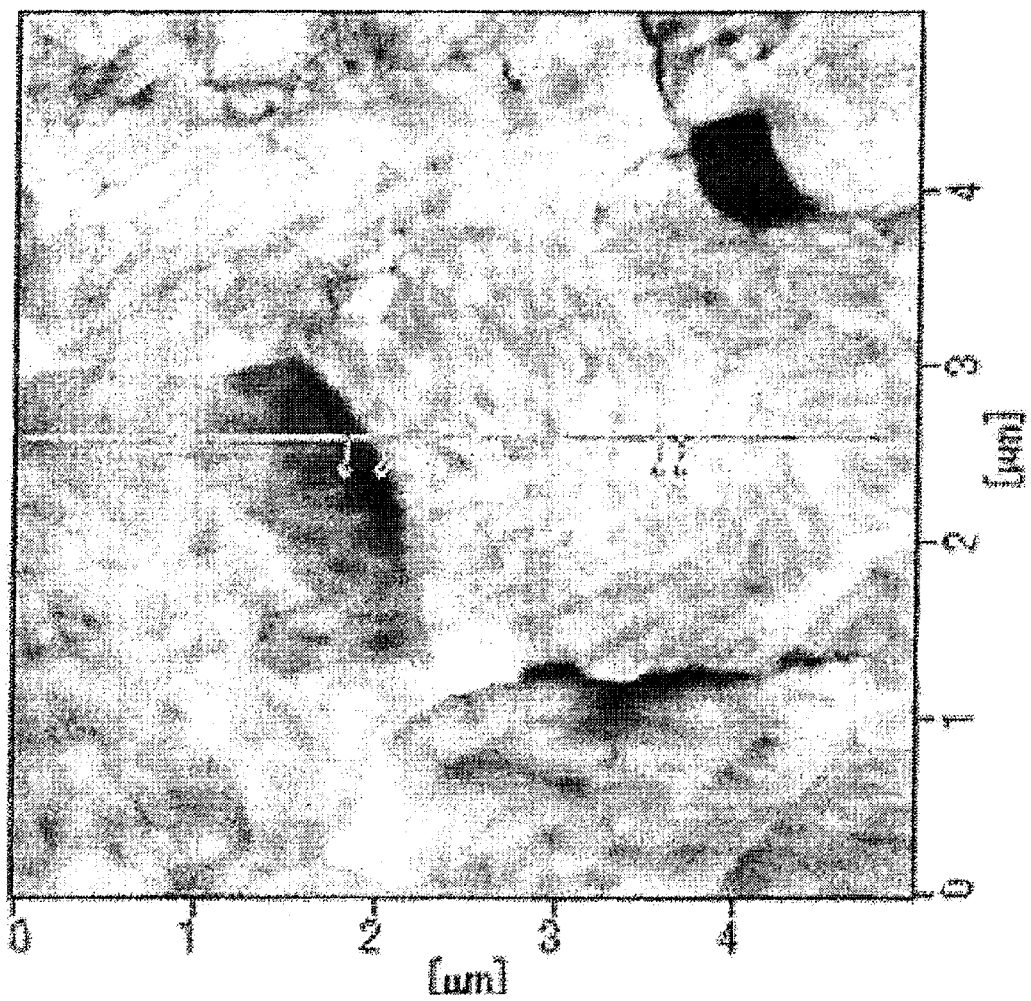
FIGS. 9A to 9C are drawings illustrating a result of observation of the surface of an cathode wiring according to Comparative Example, after the high-temperature treatment.
Figures 9B, 9C:
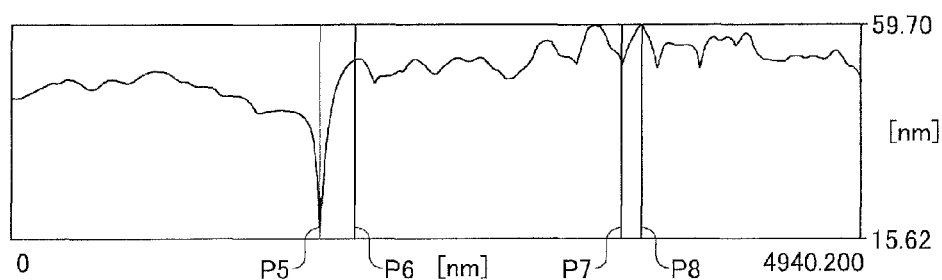

FIGS. 9A to 9C show results of observation of the surface of the cathode wiring of the comparative example, after the high-temperature treatment. FIG. 9A is an AFM image of the surface of the cathode wiring, FIG. 9B is a cross sectional profile of the surface of the cathode wiring obtained by the AFM. The first row of the table in FIG. 9C shows the height Z1 at position P5 in FIG. 9B, height Z2 at position P6, difference in height between position P5 and position P6, and the distance between position P5 and position P6. The second row of the table in FIG. 9C shows the height Z1 at position P7 in FIG. 9B, height Z2 at position P8, difference in height between position P7 and position P8, and the distance between position P7 and position P8. Note that results of observation of the surface of the cathode wiring of the comparative example before the high-temperature treatment were substantially the same as those of the surface of the cathode wiring of this embodiment before the high-temperature treatment.

It is understood from the results of observation illustrated in FIGS. 9A to 9C that the cathode wiring composed of Au of the comparative example produced hillocks (bright area in FIG. 9A) and voids (dark area in FIG. 9A) after the high-temperature treatment, with a roughness of largely exceeding 5 nm, proving that bonding with the aid of intermolecular force was not feasible. These sorts of hillocks and voids start to appear at around 200° C., and the high-temperature treatment conducted at 250° C. to 400° C. gives similar results with those obtained in the process at 350° C. described in the above.

On the other hand, it is understood from the results of observation illustrated in FIGS. 8A to 8C that the cathode wiring composed of AuGeNi of this embodiment showed neither hillocks nor voids even after the high-temperature treatment, with a roughness of 5 nm or smaller, proving that bonding with the aid of intermolecular force was feasible. This was supposedly because the cathode wiring was obtained by alloying the base metal with impurities added thereto, so that the atoms were suppressed from migrating as compared with those in pure metal, and thereby the hillocks and voids became less likely to be produced.

<Advantages>

As described in the above, in this Embodiment 1, the light emitting device has the wiring containing the AuGeNi layer, and the semiconductor light emitting element bonded to the surface of the AuGeNi layer with the aid of intermolecular force and electrically connected to the wiring. According to this Embodiment 1, the light emitting device having excellent heat dissipation from the semiconductor light emitting element can be obtained. More specifically, by using AuGeNi for the wiring, the hillocks and the voids can be suppressed from being produced during the high-temperature treatment, and thereby the surface roughness of the wiring can be suppressed to 5 nm or smaller. Accordingly, the semiconductor light emitting element and the wiring can be directly bonded with the aid of intermolecular force, so that the heat dissipation performance can be improved as compared with the configuration in which the both are bonded while placing the planarizing insulating film in between as described in Japanese Laid-Open Patent Publication No. 2010-199176, and thereby the semiconductor light emitting element can be suppressed from being degraded in the element characteristics or in the service life due to self heating. Such improvement in the heat dissipation performance is beneficial particularly for devices having the semiconductor light emitting elements integrated on the substrate, since effect on element characteristics and service life from the self heating of the semiconductor light emitting elements has been becoming larger, with recent increase in the degree of integration.

Embodiment 2

Figure 10:
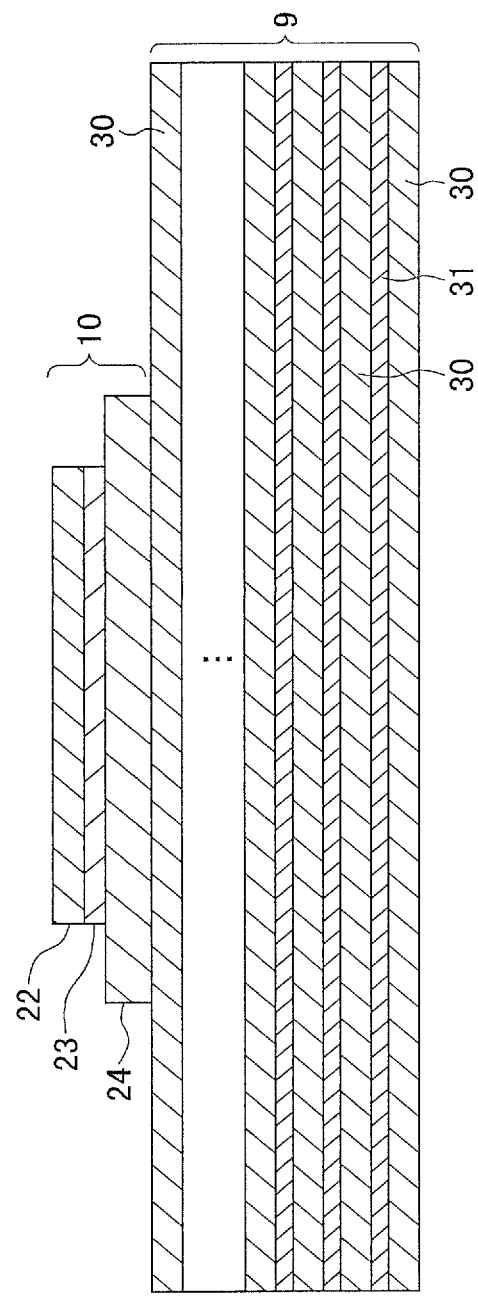
FIG. 10 is a cross sectional view illustrating a layer structure of an cathode wiring of a light emitting device according to Embodiment 2.

FIG. 10 is a cross sectional view illustrating a layer structure of the cathode wiring of a light emitting device according to Embodiment 2. The light emitting device in this Embodiment 2 is similar to the light emitting device in Embodiment 1, except for the structure of the cathode wiring. In the description below, all elements similar to, or corresponding to those in Embodiment 1 will be given the same reference numerals or symbols, so as to avoid repetitive explanation, or to simplify the explanation.

In this embodiment, the cathode wiring 9 has a stacked structure of one or more AuGeNi layers 30, and one or more metal layers 31 larger in electro-conductivity than the AuGeNi layers 30. The AuGeNi layers 30 are typically formed by using AuGeNi with a mixing ratio of 90 wt %:5 wt %:5 wt %. The metal layers 31 are typically made of Au-based metal or Al-based metal. In the example illustrated in FIG. 10, the cathode wiring 9 has a layered structure in which the AuGeNi layers 30 and the metal layers 31 are alternately formed, with one of the AuGeNi layers 30 disposed as a surface layer.

From the viewpoint of reducing the resistance of the cathode wiring 9, the overall thickness of the cathode wiring 9 is preferably large, and typically 300 nm or larger. On the other hand, from the viewpoint of manufacturing cost, the overall thickness of the cathode wiring 9 is preferably small, and typically 1000 nm or smaller. An exemplary cathode wiring 9 has a ten layer structure in which 50-nm-thick AuGeNi layers 30 and 50-nm-thick metal layers 31 are alternately stacked, to give a total thickness of cathode wiring 9 of 500 nm.

As described in the above, the wiring of this Embodiment 2 has a stacked structure of a AuGeNi layer, and a metal layer larger in electro-conductivity than the AuGeNi layer. According to this Embodiment 2, the resistivity of the wiring can be reduced as compared with the wiring solely composed of the AuGeNi layer, while suppressing the surface roughness of the wiring. By virtue of the configuration, the drive voltage of the whole system can be suppressed, amount of heat generation of the whole system can be reduced, and thereby the semiconductor light emitting element can be suppressed from being degraded in the element characteristics or in the service life due to heat generation in the whole system.

While the above description illustrates the case where the AuGeNi layer 30 is disposed as a surface layer, the metal layer 31 may alternatively be disposed as a surface layer. Since the roughness of the surface of the AuGeNi layer 30 is small, the surface roughness of the wiring can be suppressed to 5 nm or smaller, if the metal layer 31 composed of Au, Al or the like formed on the surface of the AuGeNi layer 30 is not so thick. In the case where the metal layer 31 is disposed as a surface layer, the thickness of the metal layer 31 may be adjusted so as to suppress the surface roughness of the wiring, after the high-temperature treatment, to 5 nm or smaller. The thickness is preferably 100 nm or smaller, and more preferably 50 nm or smaller.

Embodiment 3

Figure 11:
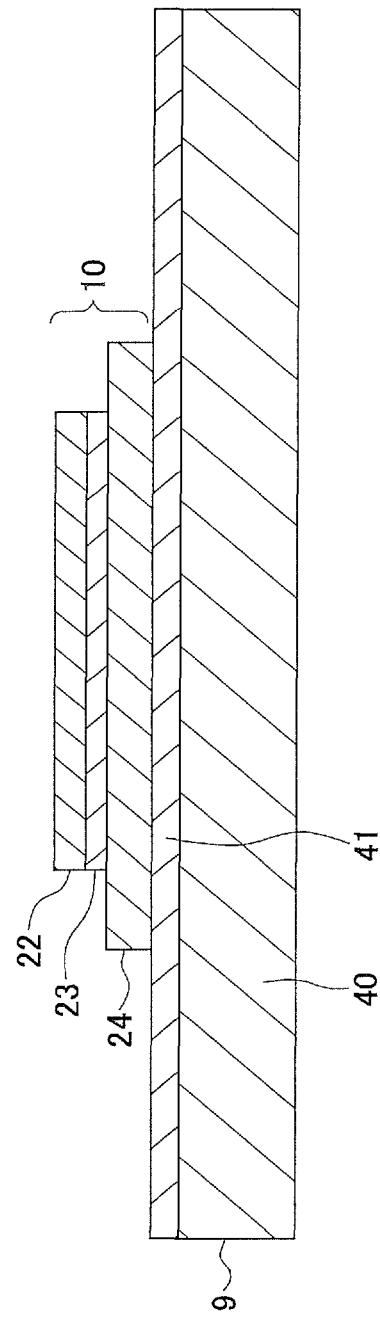
FIG. 11 is a cross sectional view illustrating a layer structure of an cathode wiring of a light emitting device according to Embodiment 3.

FIG. 11 is a cross sectional view illustrating a layer structure of the cathode wiring of a light emitting device according to Embodiment 3. The light emitting device in this Embodiment 3 is similar to the light emitting device in Embodiment 1, except for the structure of the cathode wiring. In the description below, all elements similar to, or corresponding to those in Embodiment 1 will be given the same reference numerals or symbols, so as to avoid repetitive explanation, or to simplify the explanation.

In this embodiment 3, on an AuGeNi layer 40 of the cathode wiring 9, there is formed a reflective metal layer 41 which reflects light from the semiconductor light emitting element 10, and the semiconductor light emitting element 10 is bonded to the surface of the reflective metal layer 41 with the aid of intermolecular force. The AuGeNi layer 40 is typically made of AuGeNi with a mixing ratio of 90 wt %:5 wt %:5 wt %. The reflective metal layer 41 is made of a metal material capable of effectively reflecting the light from the semiconductor light emitting element 10 (more specifically, the light emitted by the light emitting layer 23 and transmitted through the N-type semiconductor layer 24). More specifically, the reflective metal layer 41 is configured so as to show a larger reflectivity of the light from the semiconductor light emitting element 10, than the AuGeNi layer 40 shows. Material of the reflective metal layer 41 may be selected depending on the wavelength of light emitted from the semiconductor light emitting element 10. For example, if the light is in the wavelength range of 550 nm or shorter, typically in the blue region (450 to 500 nm), Al-based metal such as Al, Ni/Al, Ni/Al-SiCu, and Ti/Al, which is highly reflective to the light of such wavelength region, is preferably used as the material for the reflective metal layer 41, rather than Au-based metal having large crystal lattice and is highly absorptive to the light in the shorter wavelength region. The Au-based metal may be used for the light of longer wavelength region, typically in the red region.

Since the roughness of the surface of the AuGeNi layer 40 is small, the surface roughness of the wiring can be suppressed to 5 nm or smaller, if the reflective metal layer 41 formed on the surface of the AuGeNi layer 40 is not so thick. The thickness of the reflective metal layer 41 is adjusted so as to suppress the surface roughness of the wiring, after the high-temperature treatment, to 5 nm or smaller. For example, in the case where Al is used as the material of the reflective metal layer 41, the thickness of the reflective metal layer 41 is preferably 100 nm or smaller from the viewpoint of suppressing the roughness, and more preferably 50 nm or smaller. On the other hand, a certain level of thickness is necessary for the purpose of reflecting the light. The thickness of the reflective metal layer 41, from the viewpoint of reflectivity of light, is preferably 10 nm or larger, and more preferably 20 nm or larger. In one exemplary case, the reflective metal layer 41 is 30 nm thick. When Au is used as a material of the reflective metal layer 41, the thickness of the reflective metal layer 41 may be in the range equivalent to that of Al, or may be larger than that of Al, since Au provides a smaller surface roughness than Al.

As described in the above, in this embodiment 3, the reflective metal layer for reflecting the light from the semiconductor light emitting element is formed on the AuGeNi layer of the wiring: According to this embodiment 3, the light emitted from the semiconductor light emitting element towards the wiring can be reflected by the reflective metal layer, and thereby efficiency of extraction of light can be improved, while successfully suppressing the roughness of the surface of the wiring.

Embodiment 4

Figure 12:
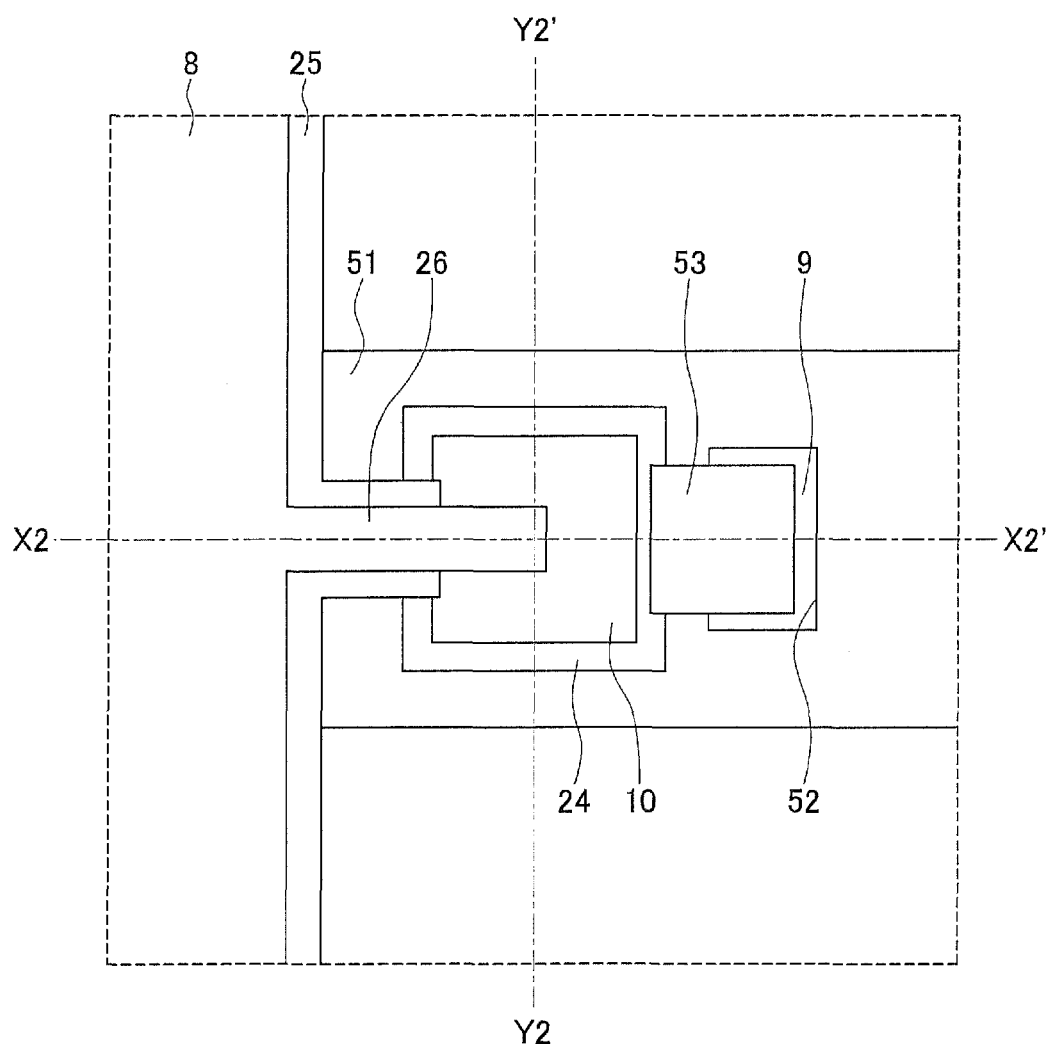
FIG. 12 is a plan view illustrating a light emitting device according to Embodiment 4.

FIG. 12 is a plan view illustrating a light emitting device according to Embodiment 4. FIG. 13A and FIG. 13B are cross sectional views of the light emitting device illustrated in FIG. 12, taken along line X2-X2' and line Y2-Y2', respectively. The light emitting device is similar to the light emitting device in Embodiment 1, except that a planarizing layer 51 is provided on the cathode wiring 9. In the description below, all elements similar to, or corresponding to those in Embodiment 1 will be given the same reference numerals or symbols, so as to avoid repetitive explanation, or to simplify the explanation.

In this embodiment 4, on the surface of an AuGeNi layer 50 of the cathode wiring 9, there is provided the planarizing layer 51 which planarizes the surface of the AuGeNi layer 50, and the semiconductor light emitting element 10 is bonded to the surface of the planarizing layer 51 with the aid of intermolecular force. That is, the semiconductor light emitting element 10 is bonded to the surface of the AuGeNi layer 50 of the cathode wiring 9, while placing the planarizing layer 51 in between. The planarizing layer 51 is typically an organic insulating film, inorganic insulating film or the like.

The planarizing layer 51 has, formed therein, a contact hole 52 through which a part of the cathode wiring 9 is exposed, and the part of the cathode wiring 9 exposed through the contact hole 52 and the N-type semiconductor layer 24 of the semiconductor light emitting element 10 are electrically connected through a connection line 53. The connection line 53 is made of Au-based metal such as Au, Ti/Pt/Au, Ti/Au, AuGeNi/Au and AuGe/Ni/Au, or Al-based metal such as Al, Ni/Al, Ni/AlSiCu and Ti/Al, formed by metal vapor deposition, sputtering or the like, combined with an appropriate patterning process.

As described in the above, in this Embodiment 4, the planarizing layer is formed on the surface of the AuGeNi layer of the wiring so as to planarize the surface of the AuGeNi layer, and the semiconductor light emitting element is bonded to the surface of the planarizing layer with the aid of intermolecular force. According to this embodiment 4, bonding of the semiconductor light emitting element with the aid of intermolecular force can be stabilized, even in the case where the surface of the AuGeNi layer shows a relatively large roughness. For example, a stable bonding can be obtained by forming the planarizing layer, even if the roughness of the wiring surface exceeds 5 nm, as a result of formation of the wiring by metal vapor deposition featured by a relatively large size of resultant particles. On the other hand, since the surface roughness of the AuGeNi layer is smaller than that of an Au or Al layer, only a very thin planarizing layer will suffice, as compared with the case where the Au or Al layer has to be planarized. For example, while planarization of the Au or Al layer requires a planarizing layer with a thickness of 1 μm or larger, the planarizing layer in this embodiment may be 100 nm thick or smaller. Since the planarizing layer can be greatly thinned, degradation in heat dissipation due to the planarizing layer can be suppressed, and thereby the semiconductor light emitting element can be suppressed from being degraded in the element characteristics or in the service life.

It is to be understood that the present invention is not limited to the embodiments described in the above, but may be implemented in a variety of embodiments without departing from the spirit of the invention.

For example, while the above embodiments illustrate the configuration in which the semiconductor light emitting element is bonded to the cathode wiring, another possible configuration may have a structure in which the semiconductor light emitting element is bonded to the anode wiring with the aid of intermolecular force.

While the above embodiments illustrate the light emitting element array in which the plurality of semiconductor light emitting elements are arranged to form a two-dimensional array, the plurality of semiconductor light emitting elements may alternatively be arranged to form a linear array. More specifically, the light emitting element array may have one or more wirings including an AuGeNi layer; and a plurality of semiconductor light emitting elements arranged on the one or more wirings so as to form a linear array, each semiconductor light emitting element being bonded to the surface of the AuGeNi layer of the correspondent wiring with the aid of intermolecular force, and electrically connected to the correspondent wiring. For example, the light emitting element array may be configured to have one cathode wiring including an AuGeNi layer; a plurality of semiconductor light emitting elements arranged on the cathode wiring so as to form a linear array; and a plurality of anode wirings electrically connected respectively to the correspondent semiconductor light emitting elements, each semiconductor light emitting element being bonded to the surface of the AuGeNi layer of the cathode wiring, with the aid of intermolecular force. In this configuration, the plurality of anode wirings are typically formed in parallel with the cathode wiring.

While the above embodiments exemplify the image display device, the present invention is also applicable to other devices. For example, the above-described light emitting element array having the plurality of semiconductor light emitting elements arranged to form a linear array may be applicable to an exposure device used for image forming devices such as printer. More specifically, the exposure device may be configured to have the above-described light emitting element array having the plurality of semiconductor light emitting elements arranged to form a linear array; and a drive unit electrically connected with the plurality of semiconductor light emitting elements through one or more wirings included in the light emitting element array, and configured to drive the plurality of semiconductor light emitting elements based on image information. Furthermore, an image forming device may be configured to have the exposure device; and a photoreceptor in which an electrostatic latent image is formed upon being irradiated by the plurality of semiconductor light emitting elements included in the exposure device.

Those skilled in the art will recognize that further variations are possible within the scope of the invention, which is defined in the appended claims.

What is claimed is:

1. A light emitting device comprising:
a substrate;
a wiring formed on the substrate; and
a semiconductor light emitting element bonded to a surface of the wiring opposite the substrate with the aid of intermolecular force, and electrically connected to the wiring,
wherein the wiring has a stacked structure of at least one AuGeNi layer and at least one metal layer having electro-conductivity larger than that of the at least one AuGeNi layer, and wherein one of the at least one AuGeNi layers is a surface layer to which the the semiconductor light emitting element is bonded.

2. A light emitting element array comprising:
a substrate;
one or more wirings formed on the substrate; and
a plurality of semiconductor light emitting elements arranged over the one or more wirings to form a linear array or a two-dimensional array, wherein the semiconductor light emitting elements are bonded to surfaces of the corresponding wirings opposite the substrate with the aid of intermolecular force, and are electrically connected to the corresponding wirings,
wherein each wiring has a stacked structure of at least one AuGeNi layer and at least one metal layer having electro-conductivity larger than that of the at least one AuGeNi layer, and wherein in each wiring one of the at least one AuGeNi layers is a surface layer to which the semiconductor light emitting element is bonded.

3. An image display device comprising:
a plurality of wirings each including an AuGeNi layer, extended in a first direction, and arranged in a second direction which crosses the first direction;
a plurality of semiconductor light emitting elements arranged over the plurality of wirings in the first and second directions to form a two-dimensional array, each of which being bonded to the surface of the AuGeNi layer of the correspondent wiring with the aid of intermolecular force, and being electrically connected to the correspondent wiring; and
a drive unit electrically connected through the plurality of wirings to the plurality of semiconductor light emitting elements, so as to drive the plurality of semiconductor light emitting elements based on image information,
wherein each of the wirings has a stacked structure of the AuGeNi layer and a metal layer having electro-conductivity larger than that of the AuGeNi layer, each of the wirings including the AuGeNi layer as a surface layer facing the semiconductor light emitting element.

4. The light emitting device according to claim 1, wherein the AuGeNi layer has a mixing ratio of Au with Ge and Ni of 86 to 94 wt %:3 to 7 wt %:3 to 7 wt %.

5. The light emitting device according to claim 1, wherein the thickness of the wiring is 300 nm or larger and 1000 nm or smaller.

6. The light emitting device according to claim 4, wherein the thickness of the wiring is 300 nm or larger and 1000 nm or smaller.

7. The light emitting device according to claim 1, wherein the wiring has a layered structure in which the AuGeNi layer and the metal layer are alternately formed.

8. The light emitting device according to claim 4, wherein the wiring has a layered structure in which the AuGeNi layer and the metal layer are alternately formed.

9. The light emitting device according to claim 5, wherein the wiring has a layered structure in which the AuGeNi layer and the metal layer are alternately formed.

10. The light emitting device according to claim 1, wherein the AuGeNi layer and the metal layer have the same thickness.

11. The light emitting device according to claim 4, wherein the AuGeNi layer and the metal layer have the same thickness.

12. The light emitting device according to claim 5, wherein the AuGeNi layer and the metal layer have the same thickness.

13. The light emitting device according to claim 7, wherein the AuGeNi layer and the metal layer have the same thickness.

14. A method of manufacturing a light emitting device, the method comprising:
forming a wiring on a first substrate;
forming a semiconductor light emitting element on a second substrate; and
transferring the semiconductor light emitting element from the second substrate onto the wiring and bonding the semiconductor light emitting element with the aid of intermolecular force to a surface of the wiring opposite the first substrate,
wherein the wiring comprises a stacked arrangement of at least one AuGeNi layer and at least one metal layer having electro-conductivity larger than that of the at least one AuGeNi layer, and wherein one of the at least one AuGeNi layers is a surface layer to which the semiconductor light emitting element is bonded.

* * * * *